United States Patent
Lin et al.

(10) Patent No.: US 8,828,757 B2
(45) Date of Patent: Sep. 9, 2014

(54) LIGHT-EMITTING DEVICE AND METHOD FOR MANUFACTURING THE SAME

(75) Inventors: Chih-Yuan Lin, Zhunan Township (TW); Shih-Yi Lien, Yangmei (TW); Cheng-Hsing Chiang, Yuanlin Township (TW); Chih-Hung Pan, New Taipei (TW)

(73) Assignee: Epistar Corporation, Hsinchu (TW)

( * ) Notice: Subject to any disclaimer, the term of this patent is extended or adjusted under 35 U.S.C. 154(b) by 449 days.

(21) Appl. No.: 13/209,827

(22) Filed: Aug. 15, 2011

(65) Prior Publication Data

US 2013/0045551 A1 Feb. 21, 2013

(51) Int. Cl.
*H01L 33/30* (2010.01)
*H01L 21/20* (2006.01)
*H01L 21/329* (2006.01)

(52) U.S. Cl.
USPC ............. 438/29; 438/46; 438/478; 257/94; 257/99

(58) Field of Classification Search
USPC ............ 438/22, 29, 535; 257/88, 94, 99, 676
See application file for complete search history.

(56) References Cited

U.S. PATENT DOCUMENTS

| 5,317,170 | A  | * | 5/1994 | Paoli ............................... 257/88 |
| 7,256,483 | B2 | * | 8/2007 | Epler et al. ..................... 257/676 |
| 2006/0006398 | A1 | * | 1/2006 | Hata ................................. 257/94 |
| 2010/0264452 | A1 | * | 10/2010 | Zimmerman et al. .......... 257/99 |
| 2011/0024775 | A1 | * | 2/2011 | Zimmerman et al. .......... 257/94 |

\* cited by examiner

*Primary Examiner* — Olik Chaudhuri
*Assistant Examiner* — John M Parker
(74) *Attorney, Agent, or Firm* — Ditthavong & Steiner, P.C.

(57) ABSTRACT

A light-emitting device and method for manufacturing the same are described. A method for manufacturing a light-emitting device comprising steps of: providing a growth substrate, wherein the growth substrate has a first surface and a second surface; forming a light-absorbable layer on the first surface of the growth substrate; forming an illuminant epitaxial structure on the light absorbable layer; providing a laser beam and irradiating the second surface of the growth substrate, wherein the laser beam wavelength is greater than 1000 nm; and removing the growth substrate.

16 Claims, 3 Drawing Sheets

LIGHT-EMITTING DEVICE AND METHOD FOR MANUFACTURING THE SAME

TECHNICAL FIELD

The present application relates to a light-emitting device and a method for manufacturing the same, and more particularly to a III-V compound semiconductor light-emitting device by removing a growth substrate therein to avoid the light being absorbed by the growth substrate.

BACKGROUND

The structure of the active layer of a conventional AlGaInP light-emitting device is normally a double heterostructure (DH) or multi-quantum wells (MQWs), and a portion of the light emitted from the active layer towards the growth substrate is totally absorbed by GaAs substrate used in the AlGaInP light-emitting device. Therefore, the external quantum efficiency of this kind of conventional AlGaInP light-emitting device is low. Besides, the thermal conductivity of GaAs is only about 44 W/m–° C. which is too low to dissipate the heat generated by the device.

SUMMARY

The present application provides a method for manufacturing a light-emitting device, comprising: providing a growth substrate, wherein the growth substrate has a first surface and a second surface; forming a light-absorbable layer on the first surface of the growth substrate; forming an illuminant epitaxial structure on the light absorbable layer; providing a laser beam and irradiating the second surface of the growth substrate, wherein the laser beam wavelength is greater than 1000 nm; and removing the growth substrate.

According to the aforementioned aspects, the present application provides a method for manufacturing a light-emitting device, further removing the light-absorbable layer by wet etching with a solution of HCl and KOH.

BRIEF DESCRIPTION OF THE DRAWINGS

The foregoing aspects and many of the attendant advantages of this application are more readily appreciated as the same become better understood by reference to the following detailed description, when taken in conjunction with the accompanying drawings, wherein.

DETAILED DESCRIPTION OF THE PREFERRED EMBODIMENTS

The present application discloses a light-emitting device and a method for manufacturing the same. In order to make the illustration of the present application more explicit, the following description is stated with reference to FIG. 1A through FIG. 3.

Figure 1A:
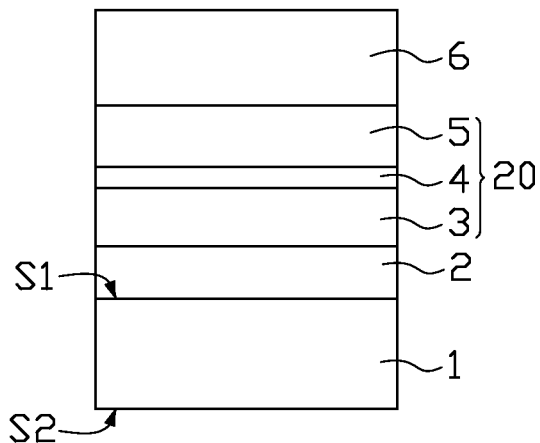
FIG. 1A through FIG. 1C are schematic flow diagrams showing the process for manufacturing a light-emitting device in accordance with a first embodiment of the present application.
Figure 1B:
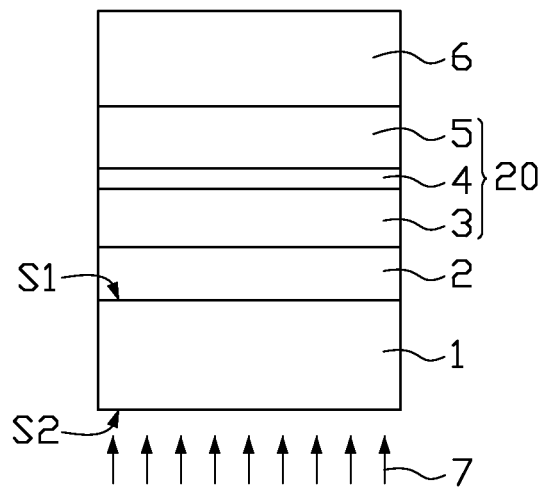
Figure 1C:
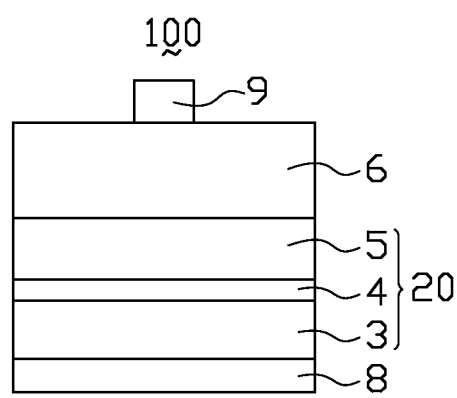

FIG. 1A through FIG. 1C are schematic flow diagrams showing the process for manufacturing a light-emitting device 100 in accordance with a first embodiment of the present application. In the present embodiment, a growth substrate 1 having a first surface S1 and a second surface S2 is provided for the epitaxial growth of epitaxial materials formed thereon, wherein a material of the growth substrate 1 may be GaAs and the thickness of the growth substrate 1 is greater than 100 μm. A light-absorbable layer 2 is grown on the first surface S1 of the growth substrate 1, and an illuminant epitaxial structure 20 is grown on the light-absorbable layer 2 by, for example, a metal organic chemical vapor deposition (MOCVD) method, a liquid phase deposition (LPD) method, or a molecular beam epitaxy (MBE) method. The light-absorbable layer 2 band-gap is smaller than 1.24 eV, which means the wavelength of the light-absorbable layer 2 is greater than 1000 nm. In the embodiment, the light-absorbable layer 2 comprises a semiconductor material having a composition of $In_xGa_{(1-x)}As_{(1-y)}N_y$, wherein $0 \leq x \leq 1$ and $0 \leq y < 1$. The illuminant epitaxial structure 20 comprises a first conductivity type group III-V compound semiconductor layer 3, an active layer 4 and a second conductivity type group III-V compound semiconductor layer 5 stacked on the light-absorbable layer 2 in sequence. For example, the first conductivity type group III-V compound semiconductor layer is n-type AlGaInP series material, the active layer is AlGaInP series material, and the second conductivity type group III-V compound semiconductor layer is p-type AlGaInP series material.

Next, a window layer 6 is deposited on the second conductivity type group III-V compound semiconductor layer 5 of the illuminant epitaxial structure 20. Next, irradiating the second surface S2 of the growth substrate 1 by a laser beam 7 to decompose the interface material between the growth substrate 1 and the light-absorbable layer 2 when the energy of the laser beam is absorbed, and the growth substrate 1 is removed. The light-absorbable layer 2 is then removed by wet etching with a solution of HCl and KOH. In another embodiment, the second surface S2 of the growth substrate 1 is irradiated by a laser beam 7 to decompose the material of the light-absorbable layer 2 when the energy of the laser beam is absorbed, and the growth substrate and the light-absorbable layer 2 are removed. The wavelength of the laser beam is greater than 1000 nm. The removed growth substrate is reusable for epitaxially growing another light-emitting device structure. The window layer material can be GaP, and the thickness of the window layer 6 is greater than 20 μm. Next, an electrode 9 is formed on the window layer 6, wherein the electrode 9 is the second conductivity type. For example, a material of the electrode 9 is Ni/Au, NiO/Au, Pd/Ag/Au/Ti/Au, Pt/Ru, Ti/Pt/Au, Pd/Ni, Ni/Pd/Au, Pt/Ni/Au, Ru/Au, Nb/Au, Co/Au, Pt/Ni/Au, Ni/Pt, NiIn, or $Pt_3In_7$. Furthermore, an electrode 8 is formed on a first conductivity type group III-V compound semiconductor layer 3 such that the electrode 9 and the electrode 8 are respectively on opposite sides of the illuminant epitaxial structure 20, wherein the electrode 8 is the first conductivity type. For example, a material of the electrode 8 is In, Al, Ti, Au, W, InSn, TiN, WSi, $PtIn_2$, Nd/Al, Ni/Si, Pd/Al, Ta/Al, Ti/Ag, Ta/Ag, Ti/Al, Ti/Au, Ti/TiN, Zr/ZrN, Au/Ge/Ni, Cr/Ni/Au, Ni/Cr/Au, Ti/Pd/Au, Ti/Pt/Au, Ti/Al/Ni/Au, Au/Si/Ti/Au/Si, or Au/Ni/Ti/Si/Ti. Now, the fabrication of a light-emitting device 100 is substantially completed as shown in FIG. 1C.

Figure 2A:
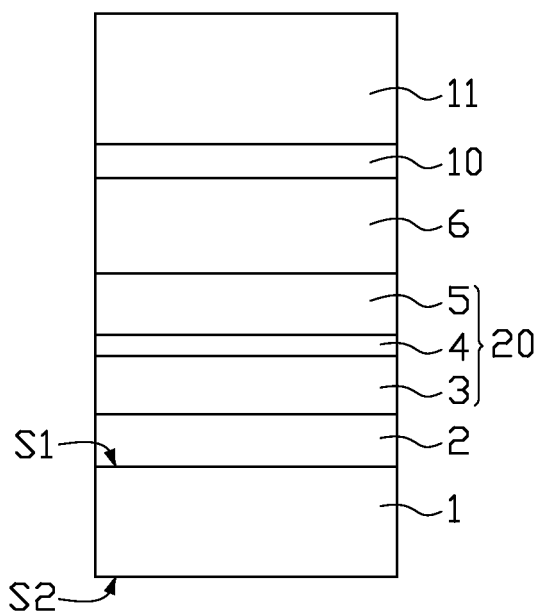
FIG. 2A through FIG. 2C are schematic flow diagrams showing the process for manufacturing a light-emitting device in accordance with a second embodiment of the present application.
Figure 2B:
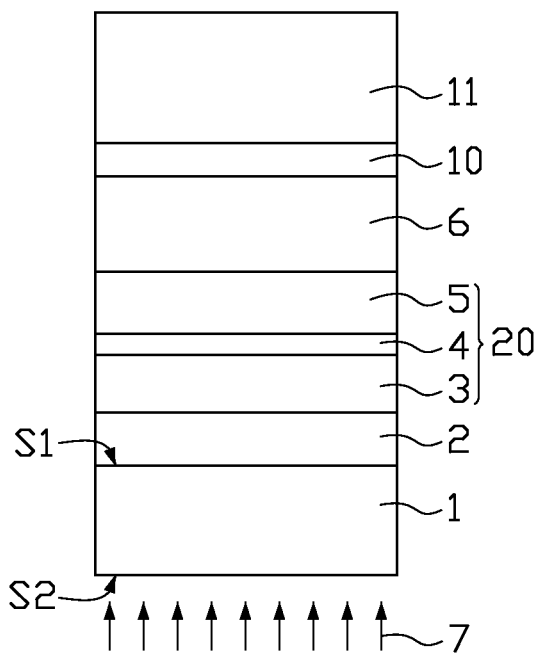
Figure 2C:
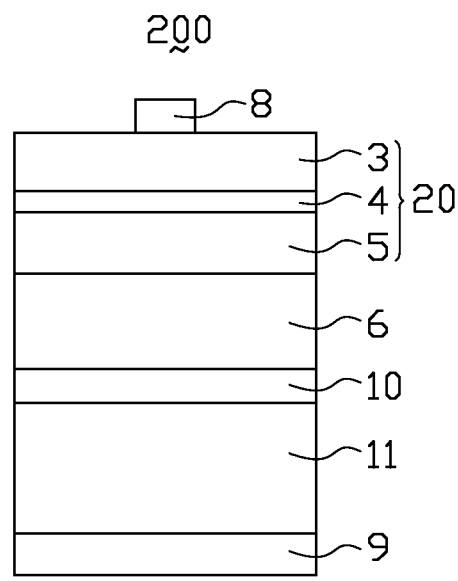

FIG. 2A through FIG. 2C are schematic flow diagrams showing the process for manufacturing a light-emitting device 200 in accordance with a second embodiment of the present application. In the present embodiment, the light-absorbable layer 2, the illuminant epitaxial structure 20, and the window layer 6 are grown on the first surface 51 of the growth substrate 1 in sequence, wherein the thickness of the window layer 6 is smaller than 5 μm. A bonding layer 10 is used to attach a permanent substrate 11 to the window layer 6, wherein the bonding layer 10 may be initially formed on the surface of the permanent substrate 11 or on the window layer 6, as shown in FIG. 2A. The material of the bonding layer 10 may be Al, Au, Pt, Zn, Ag, Ni, Ge, In, Sn, Ti, Pb, Cu, Pd, or alloys of the aforementioned metals. In another embodiment, the material of the bonding layer 10 may be silver glue, spontaneous conductive polymer, polymer materials mixed with conductive materials, or Anisotropic Conductive Glue (ACF). The permanent substrate 11 comprises a conductive material such as Si, Al, or Cu. As shows in FIG. 2B, after the permanent substrate 11 is bonded to the window layer 6, irradiating the second surface S2 of the growth substrate 1 by a laser beam 7 to decompose the interface material between the growth substrate 1 and the light-absorbable layer 2 when the energy of the laser beam is absorbed, and the growth substrate 1 is removed. The light-absorbable layer 2 is then removed by wet etching with a solution of HCl and KOH. In another embodiment, the second surface S2 of the growth substrate 1 is irradiated by a laser beam 7 to decompose the material of the light-absorbable layer 2 when the energy of the laser beam is absorbed, and the growth substrate 1 and the light-absorbable layer 2 are removed, so the first conductivity type group III-V compound semiconductor layer 3 of the illuminant epitaxial structure 20 is exposed. The wavelength of the laser beam is greater than 1000 nm. The removed growth substrate is reusable for epitaxially growing another light-emitting device structure.

Next, an electrode 9 is formed on the other surface opposite to the bonding layer 10 of the permanent substrate 11, wherein the electrode 9 is the second conductivity type. Furthermore, an electrode 8 is formed on a first conductivity type group III-V compound semiconductor layer 3, such that the electrode 9 and the electrode 8 are respectively on opposite sides of the illuminant epitaxial structure 20, wherein the electrode 8 is the first conductivity type. Now, the fabrication of a light-emitting device 200 is substantially completed as shown in FIG. 2C.

Figure 3:
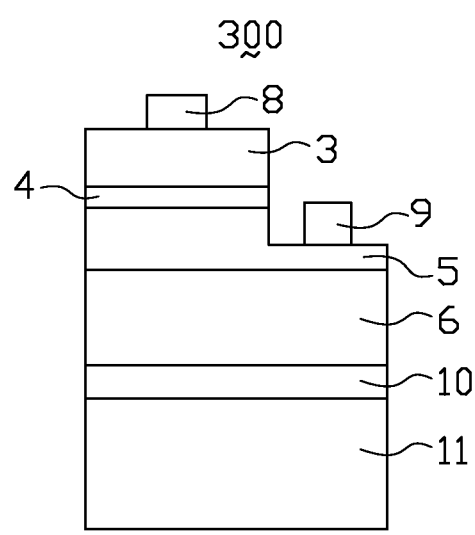
FIG. 3 shows a cross-sectional view of a light-emitting device structure in accordance with a third embodiment of the present application.

FIG. 3 shows a cross-sectional view of the light-emitting device structure 300 in accordance with a third embodiment of the present application. After the growth substrate 1 and the light-absorbable layer 2 are removed, the first conductivity type group III-V compound semiconductor layer 3 of the illuminant epitaxial structure 20 is exposed. A pattern-defining step is performed on the illuminant epitaxial structure 20 by, for example, a photolithography and etching method. In the pattern defining step, a portion of the first conductivity type group III-V compound semiconductor layer 3 and a portion of the active layer 4 are removed until a portion of the surface of the second conductivity type group III-V compound semiconductor layer 5 is exposed. Next, an electrode 9 is formed on the exposed surface of the second conductivity type group III-V compound semiconductor layer 5, wherein the electrode 9 is the second conductivity type. Furthermore, an electrode 8 is formed on a first conductivity type group III-V compound semiconductor layer 3, wherein the electrode 8 is the first conductivity type. The permanent substrate 11 comprises a non-conductive material such as sapphire, SiC, AlN, or GaN.

As is understood by a person skilled in the art, the foregoing preferred embodiments of the present application are illustrated of the present application rather than limiting of the present application. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a light-emitting device comprising steps of:
   providing a growth substrate, wherein the growth substrate has a first surface and a second surface;
   forming a light-absorbable layer on the first surface of the growth substrate, wherein the band-gap of the light-absorbable layer is smaller than 1.24 eV;
   forming an illuminant epitaxial structure on the light absorbable layer;
   providing a laser beam and irradiating the second surface of the growth substrate, wherein the wavelength of the laser beam is greater than 1000 nm; and
   removing the growth substrate.

2. The method according to claim 1, further comprising absorbing the energy of the laser beam and decomposing the material in the interface between the growth substrate and the light-absorbable layer or in the light-absorbable layer.

3. The method according to claim 2, further comprising removing the light-absorbable layer by wet etching with a solution of HCl and KOH.

4. The method according to claim 1, wherein forming the illuminant epitaxial structure comprises steps of:
   forming a first conductivity type group III-V compound semiconductor layer on the light absorbable layer;
   forming an active layer on the first conductivity type group III-V compound semiconductor layer; and
   forming a second conductivity type group III-V compound semiconductor layer on the active layer.

5. The method according to claim 4, wherein the first conductivity type group III-V compound semiconductor layer is n-type AlGaInP series material, the active layer is AlGaInP series material, and the second conductivity type group III-V compound semiconductor layer is p-type AlGaInP series material.

6. The method according to claim 1, further comprising forming a window layer on the illuminant epitaxial structure.

7. The method according to claim 6, wherein the thickness of the window layer is greater than 20 μm.

8. The method according to claim 6, wherein the thickness of the window layer is smaller than 5 μm.

9. The method according to claim 6, further comprising providing a permanent substrate on the window layer.

10. The method according to claim 9, further comprising forming a bonding layer between the window layer and the permanent substrate.

11. The method according to claim 10, wherein the material of the bonding layer may be Al, Au, Pt, Zn, Ag, Ni, Ge, In, Sn, Ti, Pb, Cu, Pd, or alloys of the aforementioned metals; silver glue, spontaneous conductive polymer, polymer materials mixed with conductive materials, or Anisotropic Conductive Glue.

12. The method according to claim 9, wherein the permanent substrate comprises a conductive material or a non-conductive material.

13. The method according to claim 1, wherein the wavelength of the light-absorbable layer is greater than 1000 nm.

14. The method according to claim 1, wherein the removed growth substrate is reusable.

15. The method according to claim 1, wherein the growth substrate is a GaAs substrate.

16. The method according to claim 15, wherein the thickness of the GaAs substrate is greater than 100 μm.

* * * * *